US010840311B2

(12) United States Patent
Yun et al.

(10) Patent No.: US 10,840,311 B2
(45) Date of Patent: Nov. 17, 2020

(54) DISPLAY DEVICE

(71) Applicant: LG Display Co., Ltd., Seoul (KR)

(72) Inventors: Jeong-Gi Yun, Paju-si (KR); Go-Eun Lim, Mokpo-si (KR)

(73) Assignee: LG DISPLAY CO., LTD., Seoul (KR)

(*) Notice: Subject to any disclaimer, the term of this patent is extended or adjusted under 35 U.S.C. 154(b) by 167 days.

(21) Appl. No.: 15/850,888

(22) Filed: Dec. 21, 2017

(65) Prior Publication Data

US 2018/0182821 A1 Jun. 28, 2018

(30) Foreign Application Priority Data

Dec. 27, 2016 (KR) .................. 10-2016-0180050

(51) Int. Cl.
| G06F 3/038 | (2013.01) |
| G09G 3/32 | (2016.01) |
| H01L 27/32 | (2006.01) |
| H01L 51/52 | (2006.01) |
| G06F 3/044 | (2006.01) |
| G06F 3/041 | (2006.01) |
| H01L 27/12 | (2006.01) |

(52) U.S. Cl.
CPC ............ H01L 27/323 (2013.01); G06F 3/044 (2013.01); G06F 3/0412 (2013.01); H01L 27/322 (2013.01); H01L 27/3258 (2013.01); H01L 27/3262 (2013.01); H01L 27/3276 (2013.01); H01L 51/5253 (2013.01); *G06F 2203/04103* (2013.01); *G06F 2203/04111* (2013.01); *G06F 2203/04112* (2013.01); *H01L 27/124* (2013.01); *H01L 27/1248* (2013.01); *H01L 27/3213* (2013.01)

(58) Field of Classification Search
CPC . G06F 3/038; G09G 5/00; G09G 3/36; G09G 3/30; G09G 3/32
See application file for complete search history.

(56) References Cited

U.S. PATENT DOCUMENTS

| 2008/0278070 A1 | 11/2008 | Kim |
| 2011/0017524 A1 | 1/2011 | Chen et al. |
| 2011/0221741 A1* | 9/2011 | Kawamura ........... H01L 27/322 345/214 |
| 2014/0036166 A1* | 2/2014 | Kurasawa ........... G02F 1/13338 349/12 |

(Continued)

FOREIGN PATENT DOCUMENTS

| CN | 105705989 A | 6/2016 |
| EP | 2680114 A2 | 1/2014 |

(Continued)

*Primary Examiner* — Pegeman Karimi
(74) *Attorney, Agent, or Firm* — Seed IP Law Group LLP

(57) ABSTRACT

Various embodiments provide a thin and lightweight organic light-emitting display device having a touch sensor. The organic light-emitting display device having a touch sensor includes a touch-sensing line and a touch-driving line disposed on an encapsulation stack so as to overlap each other. The touch-sensing line and the touch-driving line overlap each other in a location in which an organic touch dielectric film and an inorganic touch dielectric film are disposed therebetween, thereby preventing the generation of spots in the event of degeneration of the organic touch dielectric film and preventing damage to the organic touch dielectric film.

38 Claims, 9 Drawing Sheets

(56) References Cited

U.S. PATENT DOCUMENTS

| | | |
|---|---|---|
| 2014/0145979 A1 | 5/2014 | Lee |
| 2015/0212548 A1 | 7/2015 | Namkung et al. |
| 2015/0241906 A1* | 8/2015 | Tsai ........................ G06F 3/044 345/173 |
| 2016/0154499 A1 | 6/2016 | Bae et al. |
| 2016/0170521 A1 | 6/2016 | Choi et al. |
| 2016/0170524 A1 | 6/2016 | Kim et al. |
| 2016/0179259 A1 | 6/2016 | Watanabe et al. |
| 2016/0195979 A1 | 7/2016 | Lee et al. |
| 2016/0202827 A1* | 7/2016 | Bae ........................ G06F 3/044 345/174 |
| 2016/0307968 A1 | 10/2016 | Yoon et al. |
| 2016/0320872 A1 | 11/2016 | Lee et al. |
| 2016/0334904 A1 | 11/2016 | Choi et al. |
| 2017/0148859 A1* | 5/2017 | Nishinohara ....... H01L 51/5256 |
| 2017/0373128 A1* | 12/2017 | Lee .................... H01L 27/3258 |
| 2018/0039360 A1* | 2/2018 | Akimoto ............... G06F 3/0412 |
| 2018/0046287 A1* | 2/2018 | Wada ........................ B32B 7/12 |
| 2019/0393274 A1* | 12/2019 | Park .................... H01L 27/3223 |

FOREIGN PATENT DOCUMENTS

| | | |
|---|---|---|
| EP | 3 070 519 A1 | 9/2016 |
| EP | 3 088 999 A1 | 11/2016 |
| JP | 2011-040042 A | 2/2011 |
| JP | 2014-021223 A1 | 2/2014 |
| JP | 2014-049436 A | 3/2014 |
| JP | 2014-153791 A | 8/2014 |
| JP | 2014-164770 A | 9/2014 |
| JP | 2015-050245 A | 3/2015 |
| JP | 2015-176254 A | 10/2015 |
| JP | 2017-224508 A | 12/2017 |

\* cited by examiner

DISPLAY DEVICE

This application claims the benefit of Korean Patent Application No. 10-2016-0180050, filed on Dec. 27, 2016, which is hereby incorporated by reference as if fully set forth herein.

BACKGROUND

Technical Field

The present disclosure relates to a display device, and more particularly to a display device manufactured through a simplified process at reduced costs.

Description of the Related Art

A touchscreen is an input device that allows a user to input a command by selecting one of multiple instructions displayed on a screen, such as a display device, using a user's hand or an object. That is, the touchscreen converts a contact position at which the user's hand or the object directly contacts the touchscreen into an electrical signal to receive the instruction selected at the contact position as an input signal. The touchscreen has come to be increasingly used, since the touchscreen is capable of replacing an additional input device that is connected to the display device for operation, such as a keyboard or a mouse.

In most cases, the touchscreen is generally attached to the front of a display panel, such as a liquid crystal display panel or an organic electro-luminescent display panel, using an adhesive. Since the touchscreen is separately manufactured and is attached to the front of the display panel, the process is complicated and costs are increased due to the addition of an attaching step.

BRIEF SUMMARY

Accordingly, the present disclosure is directed to a display device that substantially obviates one or more problems due to limitations and disadvantages of the related art.

Various embodiments provide a display device manufactured through a simplified process at reduced costs.

Additional advantages and features of the various embodiments of the present disclosure will be set forth in part in the description as follows and in part will become apparent to those having ordinary skill in the art upon examination of the following or may be learned from practice of the various embodiments. Other advantages of the various embodiments may be realized and attained by the structure particularly pointed out in the written description and claims hereof as well as the appended drawings.

According to one embodiment, an organic light-emitting display device having a touch sensor includes a touch-sensing line and a touch-driving line disposed on an encapsulation stack so as to overlap each other. The touch-sensing line and the touch-driving line overlap each other in a location in which an organic touch dielectric film and an inorganic touch dielectric film are disposed therebetween, thereby preventing the generation of spots in the event of degeneration of the organic touch dielectric film and preventing damage to the organic touch dielectric film.

It is to be understood that both the foregoing general description and the following detailed description of the various embodiments of the present disclosure are exemplary and explanatory, and are intended to provide further explanation of the various embodiments.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and, together with the description, serve to explain the various embodiments of the present disclosure. In the drawings.

DETAILED DESCRIPTION

Reference will now be made in detail to various embodiments of the present disclosure, examples of which are illustrated in the accompanying drawings. Wherever possible, the same reference numbers will be used throughout the drawings to refer to the same or like parts.

Figure 1:
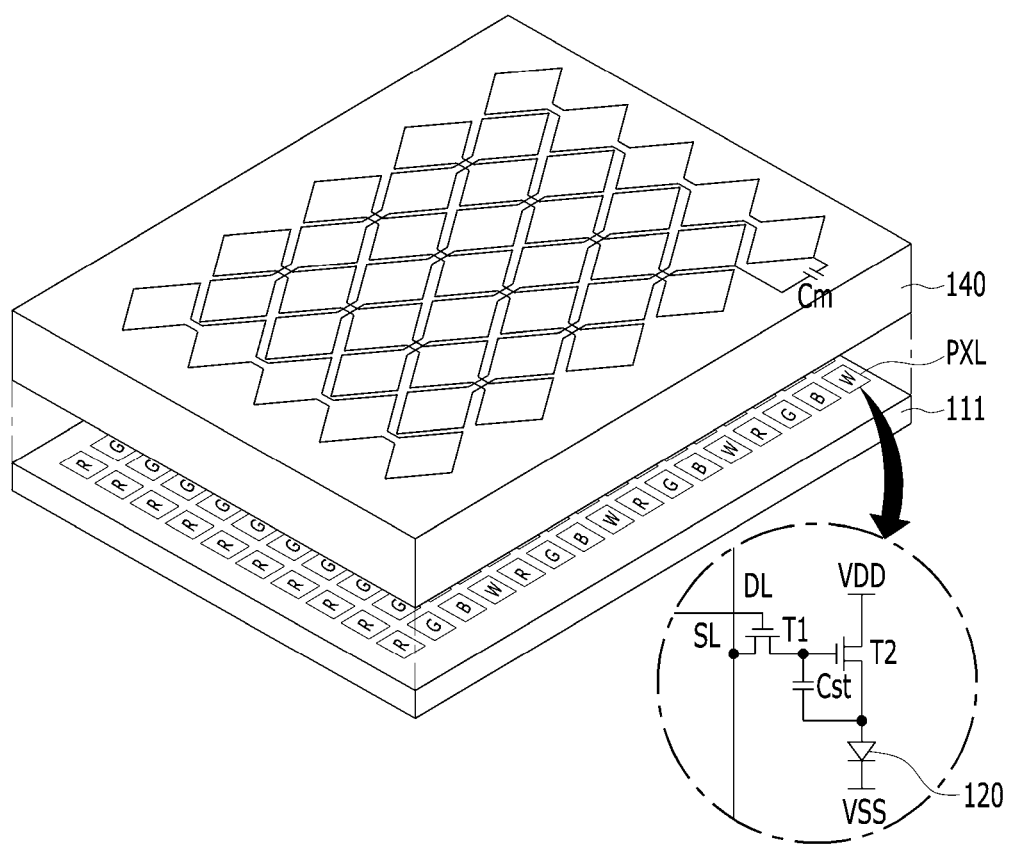
FIG. 1 is a perspective view showing an organic light-emitting display device having a touch sensor according to a first embodiment of the present disclosure.
Figure 2:
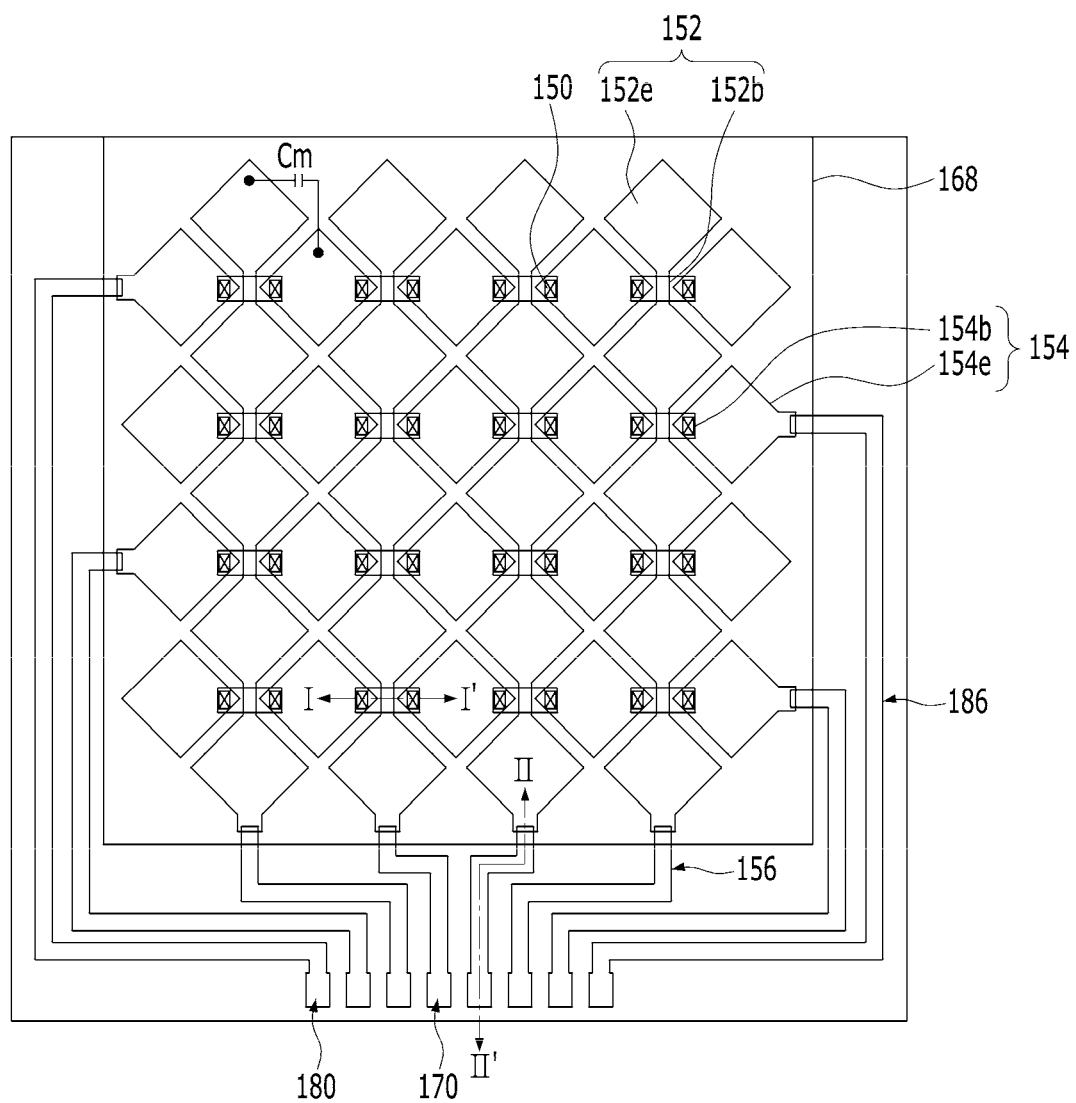
FIG. 2 is a plan view of the organic light-emitting display device having the touch sensor shown in FIG. 1.

FIG. 1 is a perspective view showing an organic light-emitting display device having a touch sensor according to a first embodiment. FIG. 2 is a plan view of the organic light-emitting display device having the touch sensor shown in FIG. 1. It is beneficial to review FIGS. 1 and 2 simultaneously.

The organic light-emitting display device, more specifically, the touch sensor detects variation in mutual capacitance Cm due to a user's touch during a touch period. The touch sensor detects variation in mutual capacitance Cm through touch electrode 152e of a touch driving line 152 and touch electrode 154e of a touch-sensing line 154 shown in FIG. 2 during a touch period. The touch sensor senses whether a touch has been performed and the touched position based on the variation in mutual capacitance Cm.

The organic light-emitting display device having the touch sensor shown in FIG. 1 displays an image through respective unit pixels. Each of the unit pixels includes a light-emitting element 120. In one embodiment, each unit pixel includes red (R), green (G), and blue (B) sub-pixels PXL. Alternatively, each unit pixel includes red (R), green (G), blue (B), and white (W) sub-pixels PXL.

To this end, the organic light-emitting display device shown in FIG. 1 includes a plurality of sub-pixels PXL arranged on a substrate 111 in, for example, a matrix fashion, an encapsulation stack 140 disposed on the sub-pixels PXL, and touch electrodes 152e and 154e disposed on the encapsulation stack 140. The encapsulation stack 140 may be composed of various layers or sublayers as explained herein.

In one embodiment, as best shown in FIG. 2, each of the touch electrodes 152e and 154e are rectangular or diamond shape. The shape of the touch electrodes 152e and 154e minimize the amount of space between the touch electrodes 152e and 154e, and maximize the total number electrodes 152e and 154e that may be included in the touch sensor.

Each of the sub-pixels PXL includes a pixel-driving circuit and the light-emitting element 120 connected to the pixel-driving circuit.

The pixel-driving circuit includes a switching transistor T1, a driving transistor T2, and a storage capacitor Cst.

When a scan pulse is supplied to a scan line SL, the switching transistor T1 is turned on to supply a data signal, which is supplied to a data line DL, to the storage capacitor Cst and a gate electrode of the driving transistor T2.

In response to the data signal being supplied to the gate electrode of the driving transistor T2, the driving transistor T2 controls current I supplied from a high-voltage (VDD) supply line to the light-emitting element 120 to adjust the amount of light emitted by the light-emitting element 120. Even when the switching transistor T1 is turned off, the driving transistor T2 supplies uniform current I to the light-emitting element 120 using the voltage charged in the storage capacitor Cst. Accordingly, the light-emitting element 120 is able to keep emitting light until a data signal of the next frame is supplied.

Figure 3:
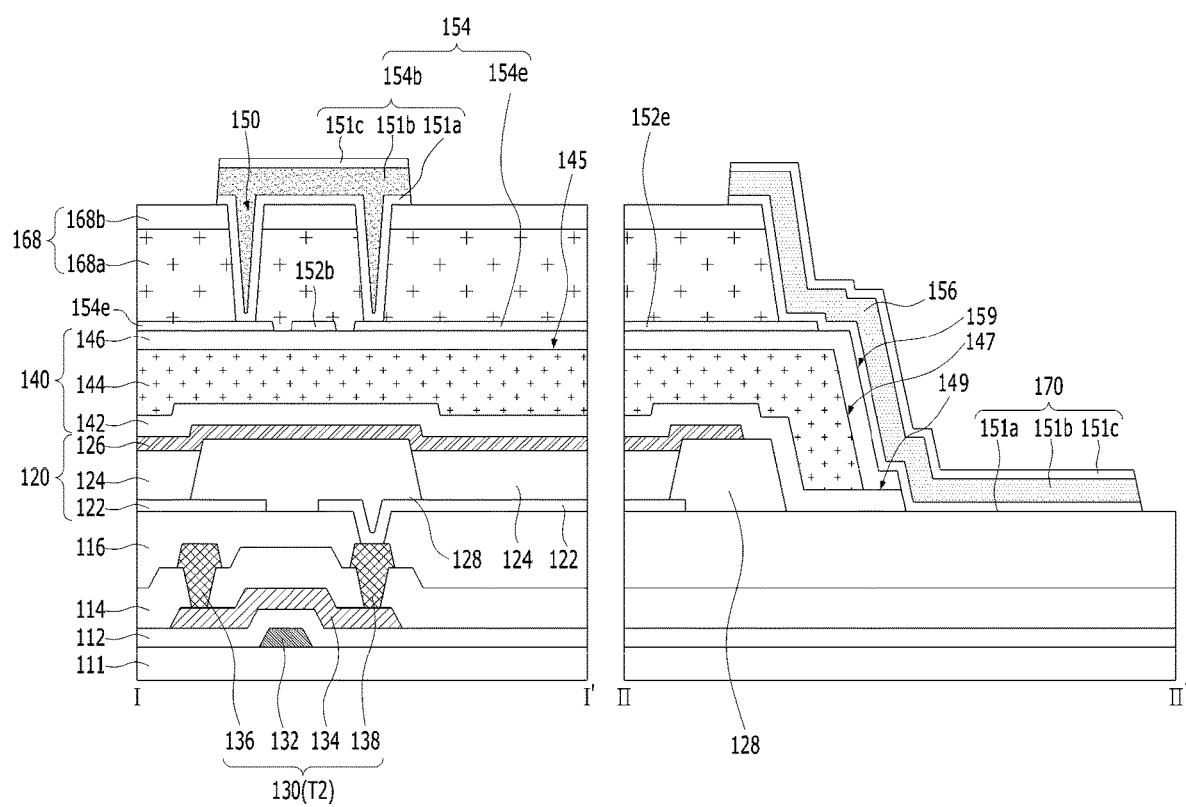
FIG. 3 is a sectional view of the organic light-emitting display device having the touch sensor shown in FIG. 1 taken along lines I-I' and II-II' of FIG. 2.

FIG. 3 is a sectional view of the organic light-emitting display device having the touch sensor shown in FIG. 1 taken along lines I-I' and II-II' shown in FIG. 2.

As shown in FIG. 3, the driving thin film transistor 130 (T2) includes a gate electrode 132, a semiconductor layer 134, and source and drain electrodes 136 and 138. The semiconductor layer 134 overlaps the gate electrode 132, and a gate dielectric film 112, which is a first dielectric film, is disposed therebetween. The source and drain electrodes 136 and 138 are formed on and extend through an interlayer dielectric film 114, which is a second dielectric film, so as to contact the semiconductor layer 134. Namely, the source and drain electrodes 136 and 138 extend from an upper surface of the interlayer dielectric film 114, through the interlayer dielectric film 114, and to the semiconductor layer 134. In one embodiment, the semiconductor layer 134 is made of at least one of an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving thin film transistor 130. Namely, the drain electrode 138 is exposed through a pixel contact hole formed through a passivation film 116, which is a third dielectric film, and the anode electrode 122 extends through the pixel contact hole to contact the drain electrode 138.

The light-emitting stack 124 is formed on the anode electrode 122 in a light-emitting area defined by a bank 128. The light-emitting stack 124 is formed by stacking a hole-related layer, an organic light-emitting layer, and an electron-related layer on the anode electrode 122 in that order or in the reverse order. The light-emitting stack 124 may include first and second light-emitting stacks opposite each other with a charge generation layer (CGL) is disposed therebetween. In this embodiment, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 may be incident on a color filter (not shown), which is located above or under the light-emitting stack 124, to realize a color image. In addition, each light-emitting stack 124 may generate colored light corresponding to each sub-pixel without an additional color filter to realize a color image. That is, the light-emitting stack 124 of the red (R) sub-pixel may generate red light, the light-emitting stack 124 of the green (G) sub-pixel may generate green light, and the light-emitting stack 124 of the blue (B) sub-pixel may generate blue light.

The cathode electrode 126 is formed so as to be opposite the anode electrode 122 with the light-emitting stack 124 disposed therebetween. In other words, the cathode electrode 126 is spaced from the anode electrode 122 by the light-emitting stack 124. The cathode electrode 126 is electrically connected to a low-voltage (VSS) supply line.

The encapsulation stack 140 prevents external moisture or oxygen from permeating into the light-emitting element 120, which has low resistance to moisture or oxygen. To this end, the encapsulation stack 140 includes a plurality of inorganic encapsulation layers 142 and 146 and an organic encapsulation layer 144 disposed between the inorganic encapsulation layers 142 and 146. In one embodiment, the inorganic encapsulation layer 146 is disposed at the uppermost layer. For example, as shown in FIG. 3, the inorganic encapsulation layer 146 is positioned further away from the cathode electrode 126 than the encapsulation layer 142. In one embodiment, the encapsulation stack 140 includes at least two inorganic encapsulation layers 142 and 146 and at least one organic encapsulation layer 144. In the present disclosure, an encapsulation stack 140 having a structure in which an organic encapsulation layer 144 is disposed between first and second inorganic encapsulation layers 142 and 146 will be described by way of example.

The first inorganic encapsulation layer 142 is formed on the substrate 111, more specifically on the cathode electrode 126, so as to be closest to the light-emitting element 120. In one embodiment, the first inorganic encapsulation layer 142 is formed directly on the cathode electrode 126. In one embodiment, the first inorganic encapsulation layer 142 is formed of an inorganic dielectric material that can be deposited at a low temperature, such as silicon nitride ($SiN_x$), silicon oxide ($SiO_x$), silicon oxide nitride (SiON), or aluminum oxide ($Al_2O_3$). In this embodiment, the first inorganic encapsulation layer 142 is deposited in a low-temperature atmosphere. As a result, it is possible to prevent damage to the light-emitting stack 124, which has low resistance to a high-temperature atmosphere, when the first inorganic encapsulation layer 142 is deposited.

The organic encapsulation layer 144 reduces stress between the layers that may occur due to bending of the organic light-emitting display device and improves planarization. In one embodiment, the organic encapsulation layer 144 is formed of an organic dielectric material, such as acrylic resin, epoxy resin, polyimide, polyethylene, or silicon oxycarbide (SiOC).

The second inorganic encapsulation layer 146 is formed so as to cover an upper surface 145 and a side surface 147 of the organic encapsulation layer 144, and to cover an upper surface 149 of the first inorganic encapsulation layer 142 that is left exposed by the organic encapsulation layer 144. Consequently, the second inorganic encapsulation layer 146 minimizes or prevents external moisture or oxygen from permeating into the first inorganic encapsulation layer 142 and the organic encapsulation layer 144. In one embodiment, the second inorganic encapsulation layer 146 is formed of an inorganic dielectric material, such as silicon nitride ($SiN_x$), silicon oxide ($SiO_x$), silicon oxide nitride (SiON), or aluminum oxide ($Al_2O_3$).

The touch-sensing line 154 and the touch-driving line 152 are disposed on the encapsulation stack 140. The touch-sensing line 154 and the touch-driving line 152 overlap each other in a location in which a touch dielectric film 168 is disposed therebetween. Mutual capacitance Cm is formed at the location where the touch-sensing line 154 and the touch-driving line 152 overlap each other. The mutual capacitance Cm charges an electric charge by a touch-driving pulse supplied to the touch-driving line 152, and discharges the charged electric charge to the touch-sensing line 154, thereby serving as a touch sensor.

The touch-driving line 152 includes a plurality of first touch electrodes 152e, and first bridges 152b for electrically interconnecting the first touch electrodes 152e.

Referring back to FIG. 2, the first touch electrodes 152e are spaced apart from each other on the second inorganic encapsulation layer 146 by a predetermined distance in an X direction, which is a first direction. Each of the first touch electrodes 152e is electrically connected to an adjacent first touch electrode 152e via a corresponding one of the first bridges 152b.

Returning to FIG. 3, the first bridges 152b are disposed on the second inorganic encapsulation layer 146. The first bridges 152b are disposed in the same plane as (i.e., coplanar with) the first touch electrodes 152e, and are electrically connected to the first touch electrode 152e without requiring the formation of additional contact holes. The first bridges 152b are also disposed in the same plane as the second touch electrodes 154e.

The touch-sensing line 154 includes a plurality of second touch electrodes 154e and second bridges 154b for electrically interconnecting the second touch electrodes 154e.

Referring back to FIG. 2, the second touch electrodes 154e are spaced apart from each other on the second inorganic encapsulation layer 146 by a predetermined distance in a Y direction, which is a second direction. Each of the second touch electrodes 154e is electrically connected to an adjacent second touch electrode 154e via a corresponding one of the second bridges 154b.

Returning to FIG. 3, the second bridges 154b are formed on the touch dielectric film 168, extend through touch contact holes 150, which are formed through the touch dielectric film 168, and contact the second touch electrodes 154e so as to be electrically connected to the second touch electrodes 154e. Namely, the second bridge 154b extends from one of the second touch electrodes 154e, over a portion of the touch dielectric film 168 and the first bridge 152b, and to another of the second touch electrodes 154e. As a result, the second bridge 154b directly overlies the first bridge 152b and is electrically isolated from the first bridge 152b. Further, the second touch electrodes 154e are electrically connected to each other via the second bridge 154b.

Similar to the first bridges 152b, the second bridges 154b are arranged so as to overlap the bank 128. By overlapping the first and second bridges 152b and 154b, it is possible to reduce the overall area used by the first and second bridges 152b and 154b, and prevent the reduction of an aperture ratio of the organic light-emitting display device.

Figure 4A:
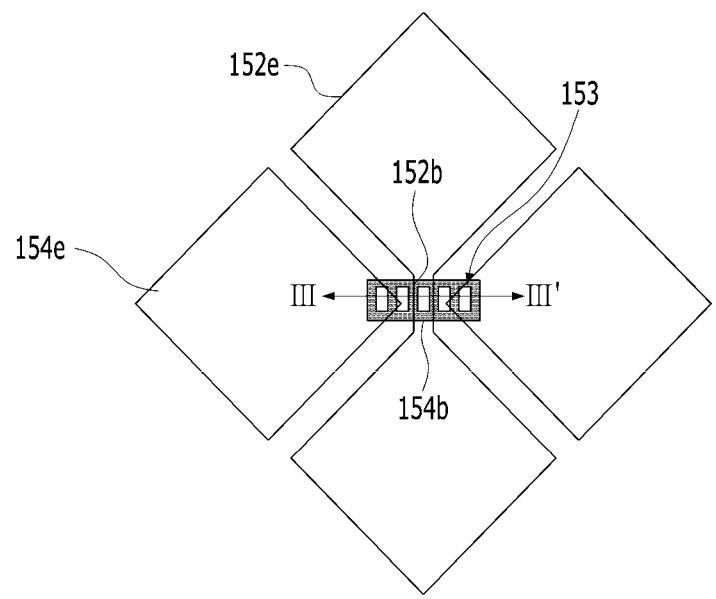
FIG. 4A is a plan view showing another embodiment of a bridge.
Figure 4B:
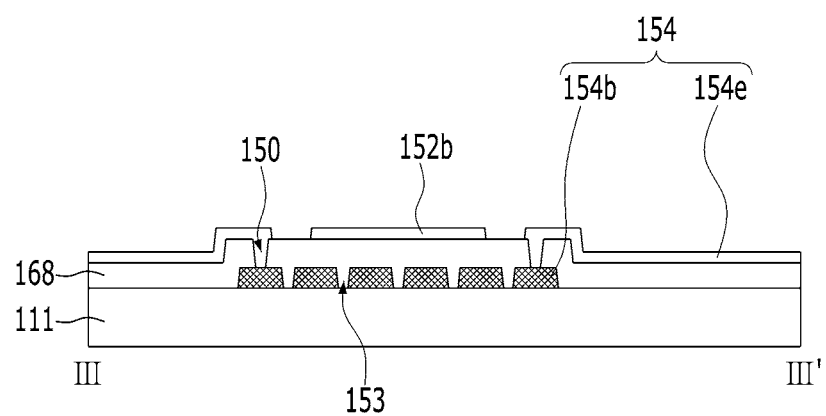
FIG. 4B is a sectional view of the another embodiment of the bridge taken along line III-III' of FIG. 4A.

FIG. 4A is a plan view showing another embodiment of the bridge 154b. FIG. 4B is a sectional view of the another embodiment of the bridge 154b taken along line III-III' of FIG. 4A. It is beneficial to review FIGS. 4A and 4B simultaneously.

As previously discussed, each of the second bridges 154b are disposed in a plane that is different from the plane in which the first bridges 152b and the touch electrodes 152e and 154e are disposed. However, in contrast to the embodiment shown in FIG. 3, the second bridges 154b as shown in FIGS. 4A and 4B are positioned closer to the substrate 111 than the first bridges 152b and the touch electrodes 152e and 154e. In addition, as the second touch electrodes 154e are positioned above the second bridges 154b, the second touch electrodes 154e extend through the touch contact holes 150 to contact the second bridges 154b.

It should be noted that, although not shown, the embodiment shown in FIGS. 4A and 4B may include any of the various layers and components discussed with respect to FIG. 3. For example, in one embodiment, the second bridges 154b as shown in FIG. 4B are formed on the second inorganic encapsulation layer 146.

In the embodiment, each of the second bridges 154b include a plurality of slits 153, as shown in FIGS. 4A and 4B. As a result, the surface area of each second bridge 154b shown in FIGS. 4A and 4B, which has a plurality of slits 153, is smaller than the surface area of each second bridge 154b shown in FIG. 2, which has no slits. Consequently, it is possible to reduce the amount of external light that is reflected by the second bridges 154b, thereby preventing the reduction of visibility.

Returning to FIGS. 2 and 3, the touch-driving line 152 is connected to a touch-driving unit (not shown) via a first routing line 156 and a touch-driving pad 170. In addition, the touch-sensing line 154 is connected to the touch-driving unit via a second routing line 186 and a touch-sensing pad 180.

The first routing line 156 electrically connects the touch-driving pad 170 to the first touch electrodes 152e, whereby a touch-driving pulse from the touch-driving pad 170 is transmitted to the touch-driving line 152. The second routing line 186 electrically connects the touch-sensing pad 180 to the second touch electrode 154e, whereby a touch signal from the touch-sensing line 154 is transmitted to the touch-sensing pad 180.

The first and second routing lines 156 and 186 contact a side surface 159 of the second inorganic encapsulation layer 146, which, in the embodiment shown in FIG. 3, is the uppermost layer of the encapsulation stack 140, so as to cover a side surface of the encapsulation stack 140.

In order to contact one of the lower dielectric films 112, 114, and 116, disposed between the substrate 111 and the encapsulation stack 140, the touch-driving pad 170 and the touch-sensing pad 180 are disposed on the dielectric film (e.g. the passivation film 116). The touch-driving pad 170 and the touch-sensing pad 180 are electrically connected to and extend from the first and second routing lines 156 and 186, respectively. Each of the touch-driving pad 170 and the touch-sensing pad 180 is formed so as to be exposed by a touch passivation film (not shown). Consequently, each of the touch-driving pad 170 and the touch-sensing pad 180 is connected to a signal transmission film, on which the touch-driving unit is mounted. The touch passivation film is formed so as to cover the touch-sensing line 154 and the touch-driving line 152, thereby preventing the touch-sensing line 154 and the touch-driving line 152 from being corroded by external moisture. In one embodiment, the touch passivation film is formed of an organic dielectric material, is configured in the form of a circular polarizer, or is formed of an epoxy or acrylic film.

In one embodiment, each of the second bridges 154b, the first and second routing lines 156 and 186, the touch-driving pad 170, and the touch-sensing pad 180 is formed to have a multi-layer structure in order to realize low resistance. For example, the second bridges 154b, the first and second routing lines 156 and 186, the touch-driving pad 170, and the touch-sensing pad 180 may each include first, second, and third touch conductive layers 151a, 151b, and 151c, which can be dry-etched. In one embodiment, each of the first, second, and third touch conductive layers 151a, 151b, and 151c is made of at least one of Ti, Al, Mo, MoTi, Cu, Ta, and ITO. That is, each of the second bridges 154b, the first and second routing lines 156 and 186, the touch-driving pad 170, and the touch-sensing pad 180 is formed to have a three-layer stack structure, such as Ti/Al/Ti, MoTi/Cu/MoTi, or Ti/Al/Mo.

In one embodiment, the touch conductive layers 151a, 151b, and 151c, which constitute the second bridges 154b, the first and second routing lines 156 and 186, the touch-driving pad 170, and the touch-sensing pad 180, are patterned and formed through a dry-etching process using a chlorine-based etching gas, such as $Cl_2$ or $Cl_3$. In the case in which the touch dielectric film disposed under the touch conductive layers 151a, 151b, and 151c is merely an organic film, the chlorine-based etching gas reacts with at least one of C, H, and O elements in the touch dielectric film, with the result that the touch dielectric film is degenerated. The degenerated touch dielectric film may be recognized as spots in the display of the organic light-emitting display device. The spots, for example, may appear in the display as areas having reduced light intensity relative to other areas of the display, darkness in areas in which light should be emitted, or areas having discoloration. In addition, the touch dielectric film is also etched by the chlorine-based etching gas, with the result that a processing margin is reduced.

To avoid degeneration of the touch dielectric film, the touch dielectric film 168 is formed to have a structure in which an organic touch dielectric film 168a and an inorganic touch dielectric film 168b are stacked, as shown in FIG. 3. In one embodiment, the organic touch dielectric film 168a is formed of an organic film material, such as acrylic resin, epoxy resin, polyimide, or polyethylene. In one embodiment, the inorganic touch dielectric film 168b is formed of an inorganic film material that can be dry-etched, such as aluminum oxide ($Al_2O_3$), tin oxide ($TiO_x$), or silicon oxide ($SiO_x$). The inorganic touch dielectric film 168b is formed on the organic touch dielectric film 168a so as to have a small thickness of 100 to 300 Å. Since the inorganic touch dielectric film 168b is formed of an inorganic film having lower hydrogen content than $SiN_x$, it is possible to prevent hydrogen in the inorganic touch dielectric film 168b from spreading into the light-emitting element 120 and active layers 134 of the transistors T1 and T2.

In one embodiment, the inorganic touch dielectric film 168b is disposed between the touch conductive layers 151a, 151b, and 151c, which constitute the second bridges 154b, the first and second routing lines 156 and 186, the touch-driving pad 170, and the touch-sensing pad 180, and the organic touch dielectric film 168a. In this embodiment, the chlorine-based etching gas, which is used at the time of etching the touch conductive layers 151a, 151b, and 151c, is prevented from reacting with the organic touch dielectric film 168a by the inorganic touch dielectric film 168b. Therefore, at the time of etching the touch conductive layers 151a, 151b, and 151c, the degeneration of the organic touch dielectric film 168a is prevented, thereby preventing the generation of spots.

In one embodiment, the inorganic touch dielectric film 168b is etched at the time of dry-etching the touch conductive layers 151a, 151b, and 151c, which have the same etching characteristics as the inorganic touch dielectric film 168b. However, the inorganic touch dielectric film 168b is etched to less than 100 to 300 Å, which is smaller than the total thickness of the inorganic touch dielectric film 168b. At the time of etching the touch conductive layers 151a, 151b, and 151c, therefore, it is possible to prevent damage to the organic touch dielectric film 168a, thereby preventing the reduction of a processing margin.

Figure 5:
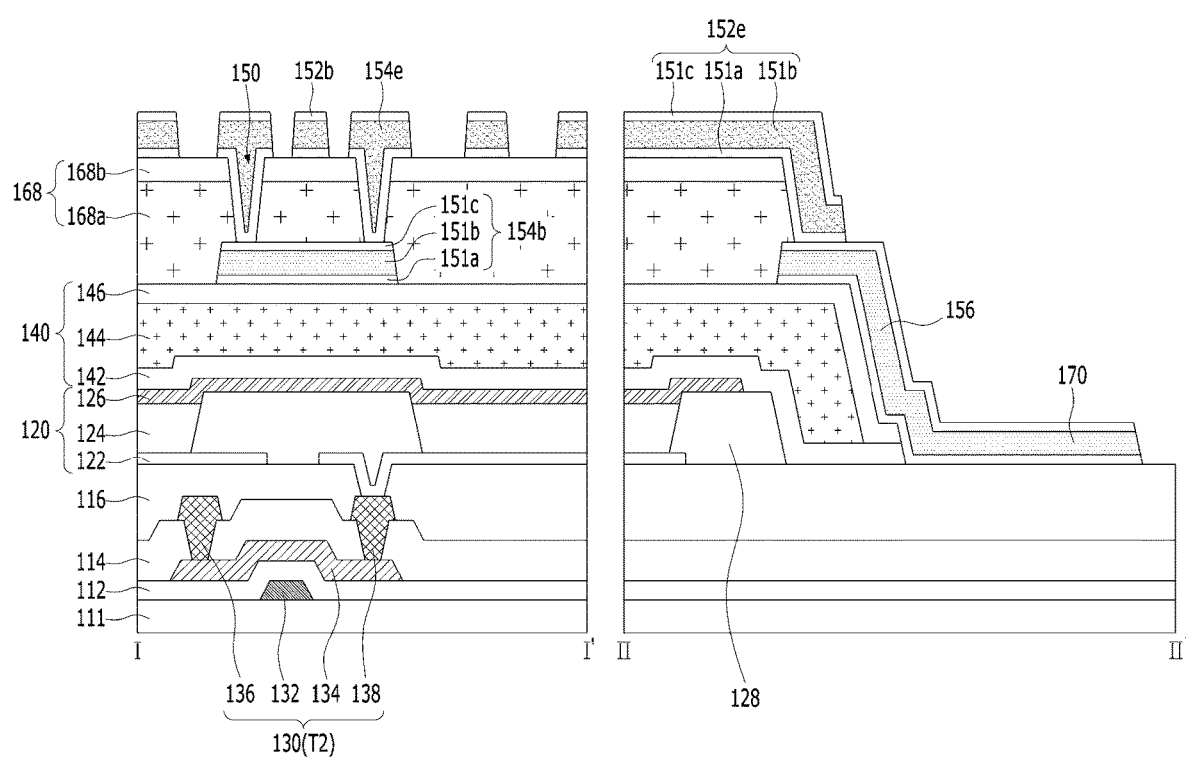
FIG. 5 is a sectional view showing an organic light-emitting display device having a touch sensor according to a second embodiment of the present disclosure taken along lines I-I' and II-II' of FIG. 2.
Figure 6:
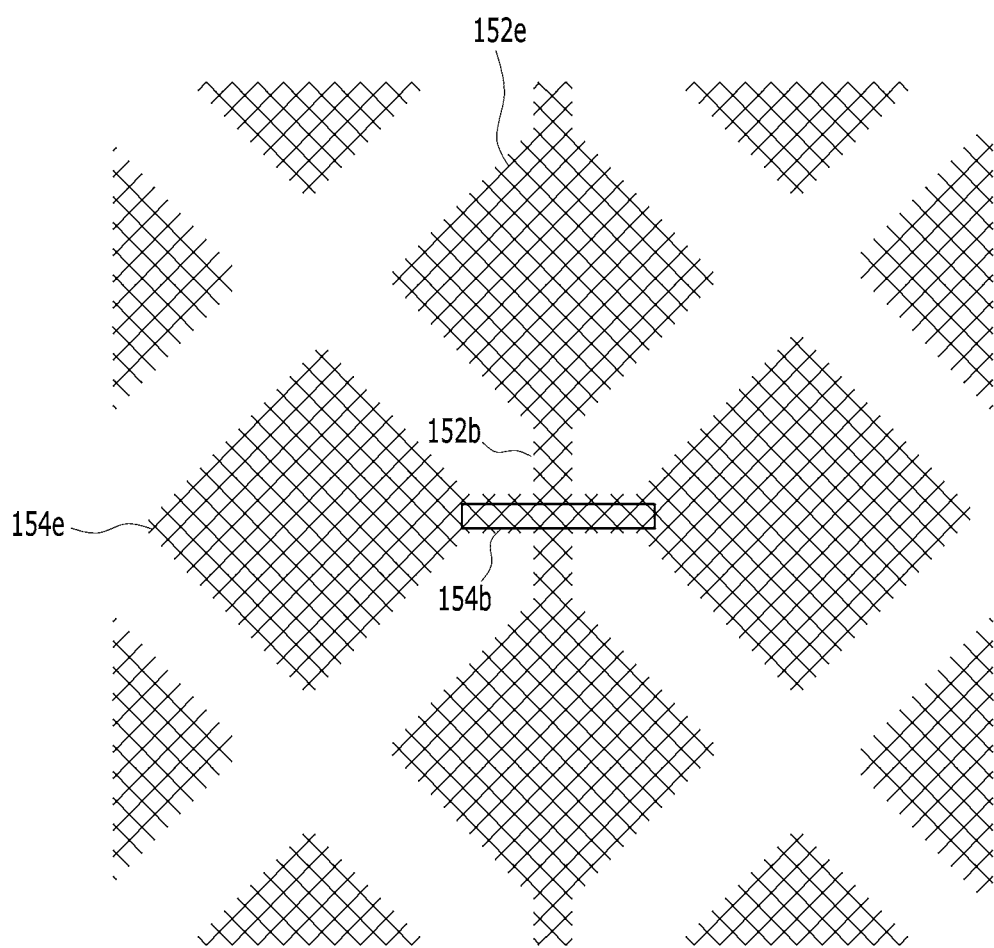
FIG. 6 is a detailed plan view of first and second touch electrodes and first and second bridges shown in FIG. 5.

FIG. 5 is a sectional view showing an organic light-emitting display device having a touch sensor according to a second embodiment taken along lines I-I' and II-II' of FIG. 2. FIG. 6 is a detailed plan view of the first and second touch electrodes 152e and 154e and the first and second bridges 152b and 154b shown in FIG. 5. It is beneficial to review FIGS. 5 and 6 simultaneously.

The organic light-emitting display device shown in FIG. 5 includes many of the same components as the organic light-emitting display device shown in FIG. 3 except for the positions of the first and second touch electrodes 152e and 154e and the first and second bridges 152b and 154b, and that at least one of the first touch electrode 152e, the second touch electrode 154e, the first bridge 152b, and the second bridge 154b have a multi-layer structure. A detailed description of the same components will be omitted to avoid obscuring the description of the second embodiment of the organic light-emitting display device.

In the second embodiment shown in FIG. 5, the first bridges 152b and the touch electrodes 152e and 154e are positioned further away from the substrate 111 than the second bridges 154b. In other words, the first bridges 152b and the touch electrodes 152e and 154e are positioned above the second bridges 154b. As the second touch electrodes 154e are positioned above the second bridges 154b, the second touch electrodes 154e extend through the touch contact holes 150 to contact the second bridges 154b. The forming of the touch electrodes 152e and 154e and the bridges 152b and 154n will be discussed in further detail with respect to FIGS. 7A to 7C.

At least one of the first touch electrode 152e, the second touch electrode 154e, the first bridge 152b, and the second bridge 154b includes at least one of the touch conductive layers 151a, 151b, and 151c. For example, in the embodiment shown in FIG. 5, the first touch electrode 152e, the second touch electrode 154e, the first bridge 152b, and the second bridge 154b each include touch conductive layers 151a, 151b, and 151c. In one embodiment, the at least one of the first touch electrode 152e, the second touch electrode 154e, the first bridge 152b, and the second bridge 154b has a structure in which the first, second, and third touch conductive layers 151a, 151b, and 151c have substantially the same line width and substantially the same shape. In one embodiment, the touch conductive layers 151a, 151b, and 151c are sequentially stacked. Namely, as shown in FIG. 5, the touch conductive layer 151b is on the touch conductive layer 151a, and the touch conductive layer 151c is on the touch conductive layer 151b.

In one embodiment, at least one of the first electrode 152e, the second touch electrode 154e, the first bridge 152b, and the second bridge 154b having the structure in which the first to third touch conductive layers 151a, 151b, and 151c are stacked is formed in a mesh pattern, as shown in FIG. 6. For example, as best shown in FIG. 6, the first touch electrode 152e, the second touch electrode 154e, the first bridge 152b, and the second bridge 154b each are formed in a mesh pattern. In one embodiment, the first and second electrodes 152e and 154e are formed in a mesh pattern, and the first and second bridges 152b and 154b are not formed in a mesh pattern. Similar to the slits 153, the mesh pattern reduces the amount of external light that is reflected. In addition, the mesh pattern reduces the overall resistivity of the component (the first touch electrode 152e, the second touch electrode 154e, the first bridge 152b, or the second bridge 154b) that is formed in a mesh pattern. As a result current flow of the component may be improved.

As previously discussed, in the embodiment shown in FIG. 5, at least one of the first touch electrode 152e, the second touch electrode 154e, the first bridge 152b, and the second bridge 154b includes at least one of the touch conductive layers 151a, 151b, and 151c. In one embodiment, the touch conductive layers 151a, 151b, and 151c are dry-etched in the same manner as the inorganic touch dielectric film 168b. In one embodiment, in the same manner as the second bridges 154b, the first and second routing lines 156 and 186, the touch-driving pad 170, and the touch-sensing pad 180, each of the touch conductive layers 151a, 151b, and 151c is formed of at least one selected from among Ti, Al, Mo, MoTi, Cu, Ta, and ITO. For example, at least one of the first touch electrode 152e, the second touch electrode 154e, the first bridge 152b, and the second bridge 154b may be formed to have a three-layer stack structure, such as Ti/Al/Ti, MoTi/Cu/MoTi, or Ti/Al/Mo.

As the first, second, and third touch conductive layers 151a, 151b, and 151c have high conductivity, in one embodiment, the first and second touch electrodes 152e and 154e are be formed as low-resistance electrodes. As a result, the resistance and capacitance of the first and second touch electrodes 152e and 154e are reduced, whereby an RC time constant is reduced and thus touch sensitivity is improved. In addition, in one embodiment, the line width of the first and second touch electrodes 152e and 154e, which are formed in the mesh pattern, is very small, with the result that it is possible to prevent the reduction of an aperture ratio and transmittance due to the opaque first, second, and third touch conductive layers 151a, 151b, and 151c included in the first and second touch electrodes 152e and 154e.

The touch dielectric film 168, which is disposed under the first and second touch electrodes 152e and 154e, is formed to have a structure in which an organic touch dielectric film 168a and an inorganic touch dielectric film 168b are stacked. In one embodiment, the organic touch dielectric film 168a is formed of an organic film material, such as acrylic resin, epoxy resin, polyimide, or polyethylene. In one embodiment, the inorganic touch dielectric film 168b is formed of an inorganic film material, such as $Al_2O_3$, $TiO_x$, or $SiO_x$, which is formed on the organic touch dielectric film 168a so as to have a small thickness of 300 to 500 Å.

As previously discussed, in the embodiment shown in FIG. 5, at least one of the first touch electrode 152e, the second touch electrode 154e, the first bridge 152b, and the second bridge 154b includes at least one of the touch conductive layers 151a, 151b, and 151c. In one embodiment, at least one the first touch electrode 152e, the second touch electrode 154e, the first bridge 152b, and the second bridge 154b is disposed on the inorganic touch dielectric film 168b. For example, in the embodiment shown in FIG. 5, the first touch electrode 152e, the second touch electrode 154e, and the first bridge 152b is disposed on the inorganic touch dielectric film 168b. In this embodiment, a chlorine-based etching gas, which is used at the time of etching the touch conductive layers 151a, 151b, and 151c, is prevented from reacting with the organic touch dielectric film 168a, which is disposed under the inorganic touch dielectric film 168b, by the inorganic touch dielectric film 168b. Therefore, at the time of etching the touch conductive layers 151a, 151b, and 151c, the degeneration of the organic touch dielectric film 168a is prevented, thereby preventing the generation of spots. Meanwhile, the inorganic touch dielectric film 168b may be etched at the time of dry-etching the touch conductive layers 151a, 151b, and 151c, which have the same etching characteristics as the inorganic touch dielectric film 168b. However, the inorganic touch dielectric film 168b is etched to less than 300 to 500 Å, which is smaller than the total thickness of the inorganic touch dielectric film 168b. Therefore, at the time of etching the touch conductive layers 151a, 151b, and 151c, it is possible to prevent damage to the organic touch dielectric film 168a, thereby preventing the reduction of a processing margin.

Figure 7A:
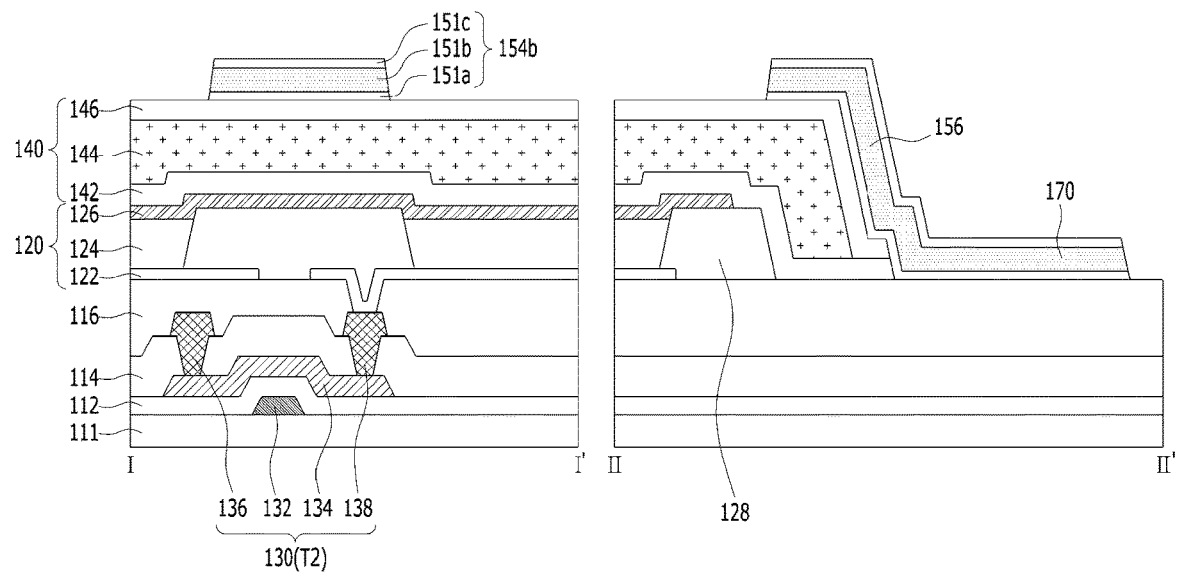
FIGS. 7A to 7C are sectional views illustrating a method of manufacturing the organic light-emitting display device shown in FIG. 5.
Figure 7B:
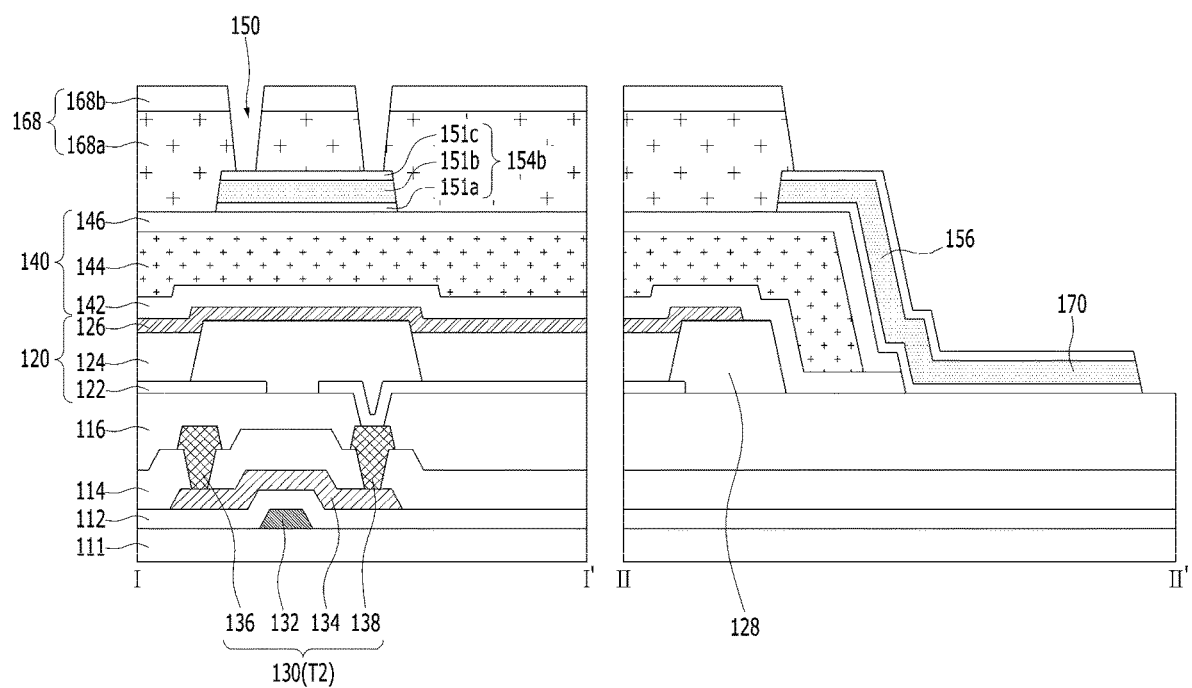
Figure 7C:
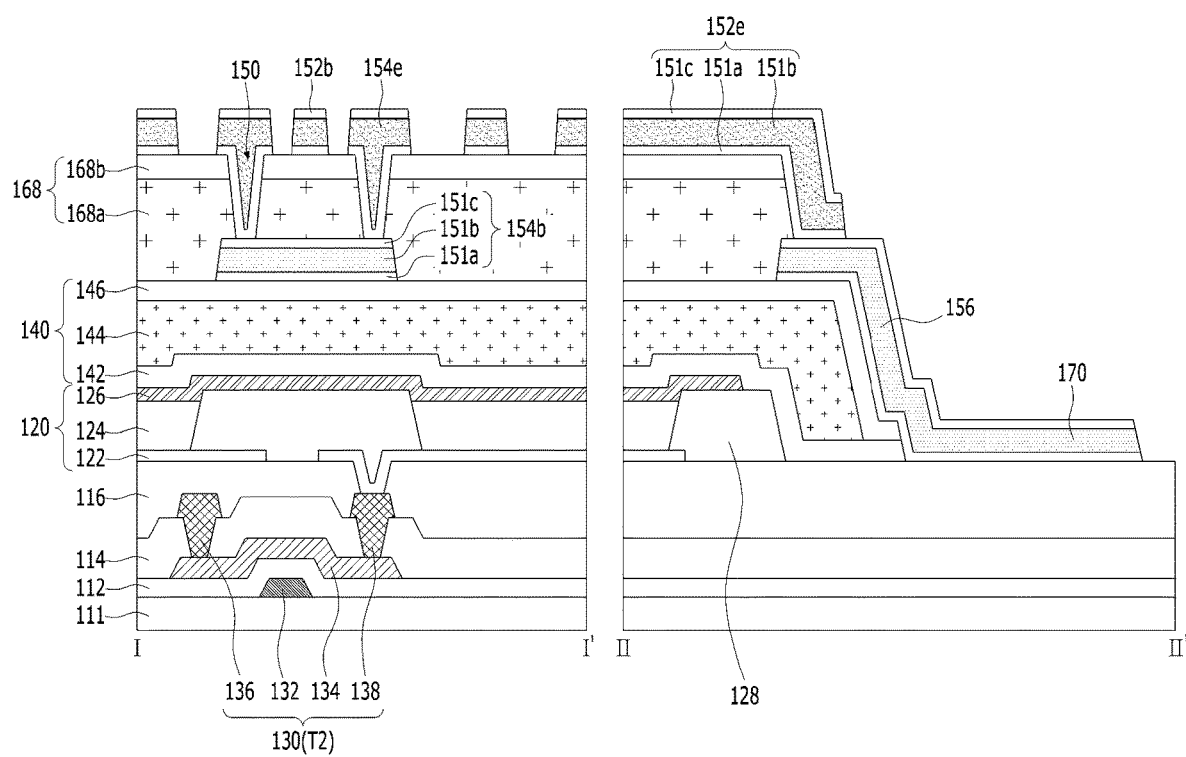

FIGS. 7A to 7C are sectional views illustrating in detail a method of manufacturing the organic light-emitting display device having the touch sensor shown in FIGS. 5 and 6.

Referring to FIG. 7A, second bridges 154b are formed on a substrate 111, on which a switching transistor T1, a driving transistor T2 (130), an organic light-emitting element 120, and an encapsulation stack 140 are formed.

The second bridges 154b are formed by depositing the first, second, and third touch conductive layers 151a, 151b, and 151c on the entirety of a substrate 111, on which a switching transistor T1, a driving transistor T2 (130), an organic light-emitting element 120, and an encapsulation stack 140 are formed. In particular, the first, second, and third touch conductive layers 151a, 151b, and 151c are formed on the inorganic encapsulation layer 146 of the encapsulation stack 140. In one embodiment, the first, second, and third touch conductive layers 151a, 151b, and 151c are deposited at room temperature through, for example, a deposition process using sputtering.

Subsequently, the first, second, and third touch conductive layers 151a, 151b, and 151c are patterned by, for example, photolithography and etching, whereby the second bridges 154b are formed. In one embodiment, each of the first, second, and third touch conductive layers 151a, 151b, and 151c is formed of a metal, such as Al, Ti, Cu, Mo, Ta, or MoTi, so as to have a single or multi-layer structure.

Referring to FIG. 7B, the touch dielectric film 168 including the organic touch dielectric film 168a and the inorganic touch dielectric film 168b having the same shape and the same line width are formed on the substrate 111, on which the second bridges 154b are formed.

The touch dielectric film 168 is formed by stacking an organic dielectric material on the substrate 111, specifically on the inorganic encapsulation layer 146 and the second bridges 154b, to form the organic touch dielectric film 168a. Next, an inorganic dielectric material is stacked on the organic touch dielectric film 168a to form the inorganic touch dielectric film 168b. Subsequently, the organic touch dielectric film 168a and the inorganic touch dielectric film 168b are simultaneously patterned by, for example, photo-lithography and etching to form touch contact holes 150.

Referring to FIG. 7C, the first and second touch electrodes 152e and 154e and the first bridges 152b are formed on the inorganic touch dielectric film 168b. The second touch electrodes 154e are also formed in the touch contact holes 150.

The first and second touch electrodes 152e and 154e and first bridges 152b are formed by depositing the first, second, and third touch conductive layers 151a, 151b, and 151c on the entirety of the inorganic touch dielectric film 168b having therein the touch contact holes 150. In one embodiment, the first, second, and third conductive layers 151a, 151b, and 151c are deposited at room temperature through a deposition process using sputtering. Subsequently, the first, second, and third touch conductive layers 151a, 151b, and 151c are patterned by, for example, photolithography and etching to form the first and second touch electrodes 152e and 154e and the first bridges 152b. In one embodiment, each of the first to third touch conductive layers 151a, 151b, and 151c is formed of a metal, such as Al, Ti, Cu, Mo, Ta, or MoTi, so as to have a single- or multi-layer structure.

Figure 8:
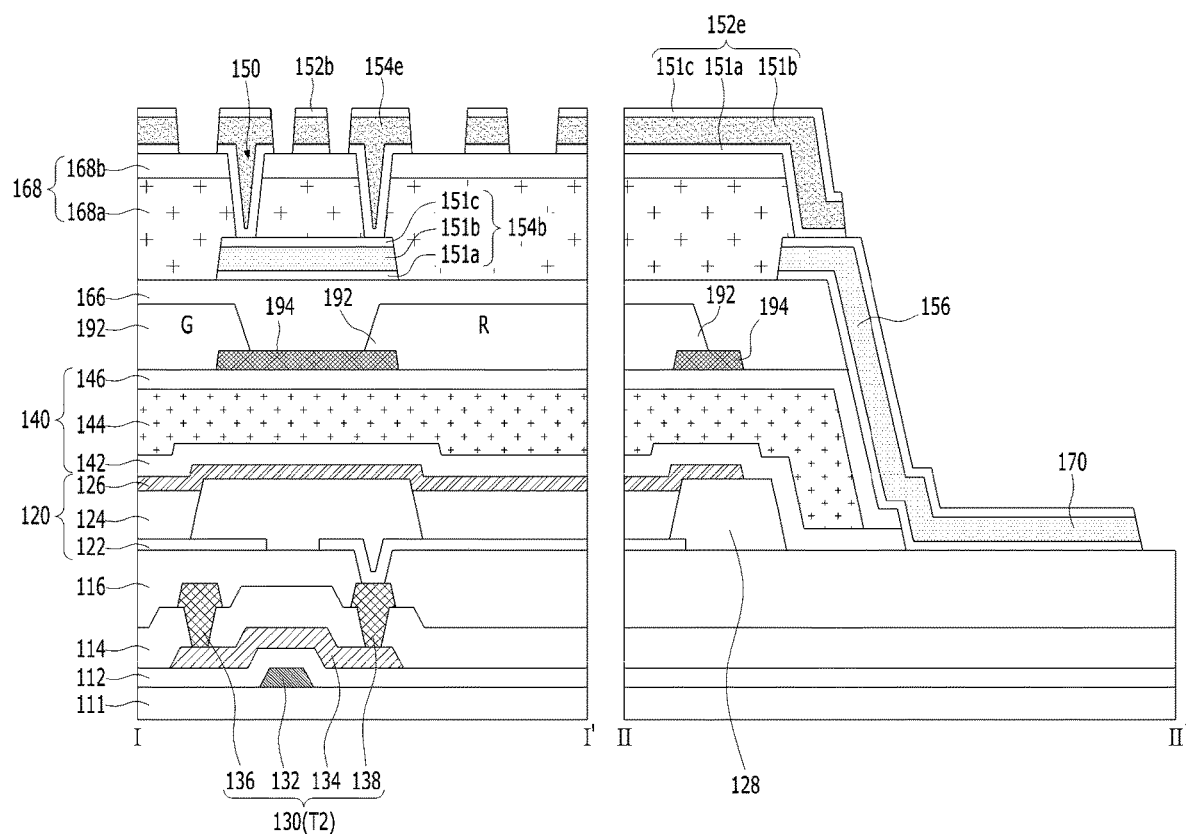
FIG. 8 is a sectional view showing an organic light-emitting display device having a touch sensor according to a third embodiment of the present disclosure taken along lines I-I' and II-II' of FIG. 2.

FIG. 8 is a sectional view showing an organic light-emitting display device according to a third embodiment taken along lines I-I' and II-II' of FIG. 2.

The organic light-emitting display device shown in FIG. 8 includes many of the same components as the organic light-emitting display device shown in FIGS. 3 and 5 except that the organic light-emitting display device shown in FIG. 8 further includes a color filter 192 disposed between the encapsulation stack 140 and the touch electrodes 152e and 154e. A detailed description of the same components will be omitted to avoid obscuring the description of the third embodiment of the organic light-emitting display device.

As shown in FIG. 8, the color filter 192 is formed between a touch-sensing line 154 and a light-emitting element 120, and between a touch-driving line 152 and the light-emitting element 120. As a result, the distance between the touch-sensing line 154 and the light-emitting element 120 and between the touch-driving line 152 and the light-emitting element 120 is increased by the color filter 192. Consequently, it is possible to minimize the capacitance value of a parasitic capacitor formed between the touch-sensing line 154 and the light-emitting element 120 and between the touch-driving line 152 and the light-emitting element 120, thereby preventing interaction due to coupling between the touch-sensing line 154 and the light-emitting element 120 and between the touch-driving line 152 and the light-emitting element 120. In addition, the color filter 192 may prevent a liquid chemical (e.g., a developing solution or an etching solution), which is used to form the touch-sensing line 154 and the touch-driving line 152 on a touch buffer film 166, or external moisture from permeating into the light-emitting stack 124. Consequently, the color filter 192 may prevent damage to the light-emitting stack 124, which has low resistance to liquid chemicals or to moisture. It should be noted that the touch electrodes 152e and 154e, as shown in FIG. 8, have been described as being disposed on the color filter 192 by way of example. Alternatively, the color filter 192 may be disposed on the touch electrodes. In this embodiment, the touch electrodes 152e and 154e are disposed between the color filter 192 and the encapsulation stack 140.

A black matrix 194 is disposed between adjacent color filters 192. The black matrix serves to divide sub-pixel areas from each other and to prevent optical interference between adjacent sub-pixels and screen bleed. For example, as shown in FIG. 8, a black matrix 194 is positioned on the inorganic encapsulation layer 146 and between the green (G) and blue (B) color filters 192. In one embodiment, the black matrix 194 is formed of a high-resistance black dielectric material.

In one embodiment, the black matrix 194 is formed by stacking at least two of red (R), green (G), and blue (B) color filters 192 on each other.

In addition, a touch planarization film 166 is formed on the substrate 111, on which the color filter 192 and the black matrix 194 are formed. The substrate 111, on which the color filter 192 and the black matrix 194 are formed, is planarized by the touch planarization film 166. That is, the touch planarization film 166 is formed on the color filters 192 and the black matrices 194 to provide a planar surface for subsequent layers, such as the second bridges 154b and the touch dielectric film 168.

As described above, in the organic light-emitting display device having the touch sensor according to the present disclosure, the organic touch dielectric film 168a and the inorganic touch dielectric film 168b are disposed between the touch-driving line 152, which has the first touch electrodes 152e and the first bridges 152b, and the touch-sensing line 154, which has the second touch electrodes 154e and the second bridges 154b. The inorganic touch dielectric film 168b prevents interaction between the organic touch dielectric film 168a and an etching gas, which is used at the time of etching a plurality of touch conductive layers 151a, 151b, and 151c that constitute the first and second touch electrodes 152e and 154e and the first and second bridges 152b and 154b. In the present disclosure, therefore, the degeneration of the organic touch dielectric film 168a is prevented, thereby preventing the generation of spots.

In addition, according to the present disclosure, the organic touch dielectric film 168a is protected by the inorganic touch dielectric film 168b at the time of etching the touch conductive layers 151a, 151b, and 151c. As a result, it is possible to prevent damage to the organic touch dielectric film 168a, thereby preventing the reduction of a processing margin.

Furthermore, in a conventional organic light-emitting display device, a touchscreen is generally attached to the organic light-emitting display device using an adhesive. In contrast, in the organic light-emitting display device according to the present disclosure, the touch electrodes 152e and 154e are disposed on the encapsulation stack 140, with the result that an additional bonding process is not required, whereby the process is simplified and costs are reduced.

As is apparent from the above description, the display device according to the present disclosure includes an organic touch dielectric film and an inorganic touch dielectric film disposed between a touch-driving line, which has first touch electrodes and first bridges, and a touch-sensing line, which has second touch electrodes and second bridges. The inorganic touch dielectric film prevents interaction between the organic touch dielectric film and an etching gas, used at the time of etching a plurality of touch conductive layers, which constitute the first and second touch electrodes and the first and second bridges. In the present disclosure, therefore, the degeneration of the organic touch dielectric film is prevented, thereby preventing the generation of spots. In addition, according to the present disclosure, the organic touch dielectric film is protected by the inorganic touch dielectric film at the time of etching the touch conductive layers. Consequently, it is possible to prevent damage to the organic touch dielectric film, thereby preventing the reduction of a processing margin. Furthermore, in a conventional organic light-emitting display device, a touchscreen is generally attached to the organic light-emitting display device using an adhesive. In contrast, in the organic light-emitting display device according to the present disclosure, the touch electrodes are disposed on an encapsulation stack, with the result that an additional bonding process is not required, whereby the process is simplified and costs are reduced.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
 a substrate;
 a light-emitting element disposed on the substrate;
 an encapsulation stack disposed on the light-emitting element;
 a touch sensor including a touch-sensing line and a touch-driving line disposed on the encapsulation stack, at least a portion of the touch-sensing line and the touch driving line overlapping each other;
 an organic touch dielectric film disposed between the touch-sensing line and the touch-driving line;
 an inorganic touch dielectric film disposed between the touch-sensing line and the touch-driving line;
 a first routing line electrically coupled to the touch-sensing line, the first routing line extending from the touch-sensing line; and
 a second routing line electrically coupled to the touch-driving line, the second routing line extending from the touch-driving line,
 wherein
 the touch-driving line includes:
 first touch electrodes arranged on the encapsulation stack in a first direction; and
 a first bridge for interconnecting the first touch electrodes,
 wherein
 the touch-sensing line includes:
 second touch electrodes arranged in a second direction that intersects the first direction; and
 a second bridge for interconnecting the second touch electrodes, and wherein
 at least one of the first touch electrodes, the second touch electrodes, the first bridge, and the second bridge is disposed on the inorganic touch dielectric film, and
 wherein the inorganic touch dielectric film and the organic touch dielectric film are disposed between the first bridge and the second bridge.

2. The display device according to claim 1 wherein the at least one of the first touch electrodes, the second touch electrodes, the first bridge, and the second bridge is formed in a mesh pattern.

3. The display device according to claim 1 wherein the at least one of the first touch electrodes, the second touch electrodes, the first bridge, and the second bridge is formed of at least one touch conductive layer having the same etching characteristics as the inorganic touch dielectric film.

4. The display device according to claim 3 wherein the at least one of the first touch electrodes, the second touch electrodes, the first bridge, and the second bridge, and the inorganic touch dielectric film are formed of a material that is capable of being dry-etched.

5. The display device according to claim 3 wherein the inorganic touch dielectric film has a single-layer structure including at least one of $Al_2O_3$, $TiO_x$, and $SiO_x$.

6. The display device according to claim 3 wherein the inorganic touch dielectric film has a multi-layer structure including at least one of $Al_2O_3$, $TiO_x$, and $SiO_x$.

7. The display device according to claim 3 wherein the at least one touch conductive layer is made of at least one of Ti, Al, Mo, MoTi, Cu, Ta, and ITO.

8. The display device according to claim 7 wherein the at least one touch conductive layer is formed in a mesh pattern.

9. The display device according to claim 8 wherein each of the first and second touch electrodes has a rectangular shape.

10. The display device according to claim 7 wherein each of the first and second touch electrodes has a rectangular shape.

11. The display device according to claim 1 wherein the first touch electrodes, the second touch electrodes, the first bridge, and the second bridge are each formed of at least one touch conductive layer made of at least one of Ti, Al, Mo, MoTi, Cu, Ta, and ITO.

12. The display device according to claim 1 wherein at least one of the first and second bridges has at least one slit.

13. The display device according to claim 1, further comprising:
 a color filter disposed between the encapsulation stack and the touch sensor.

14. The display device according to claim 1, further comprising:
 a color filter disposed on the touch sensor, the touch sensor being disposed between the color filter and the encapsulation stack.

15. The display device according to claim 1 wherein the first and second routing lines are disposed on the first and second side surfaces, respectively, of the encapsulation stack.

16. The display device according to claim 1, further comprising:
 at least one layer of dielectric film disposed between the substrate and the encapsulation stack.

17. The display device according to claim 16, further comprising:
 a first touch pad electrically coupled to the touch-sensing line via the first routing line; and
 a second touch pad electrically coupled to the touch-driving line via the second routing line.

18. The display device according to claim 17 wherein the first and second touch pads are configured to contact the at least one layer of dielectric film.

19. The display device according to claim 1 wherein inorganic touch dielectric film is spaced from the encapsulation stack by the organic touch dielectric film.

20. A display device, comprising:
 a substrate;
 a light-emitting element disposed on the substrate;
 an encapsulation stack disposed on the light-emitting element;
 a touch sensor including a touch-sensing line and a touch-driving line disposed on the encapsulation stack, at least a portion of the touch-sensing line and the touch driving line overlapping each other;
 an organic touch dielectric film disposed between the touch-sensing line and the touch-driving line;

an inorganic touch dielectric film disposed between the touch-sensing line and the touch-driving line;

a first routing line electrically coupled to the touch-sensing line, the first routing line extending from the touch-sensing line;

a second routing line electrically coupled to the touch-driving line, the second routing line extending from the touch-driving line;

at least one layer of dielectric film disposed between the substrate and the encapsulation stack;

a driving transistor electrically coupled to the light-emitting element, the driving transistor including a gate electrode, a source electrode, a drain electrode, and an active layer;

a first dielectric film disposed between the gate electrode and the active layer of the driving transistor;

a second dielectric film disposed between the active layer and the source and drain electrodes of the driving transistor; and a third dielectric film disposed between the source and drain electrodes and the light-emitting element, the at least one layer of dielectric film being at least one of the first to third dielectric films.

21. A device, comprising:

a substrate;

a light-emitting stack on the substrate;

an encapsulation stack on the light-emitting stack;

a first electrode on the encapsulation stack;

a second electrode on the encapsulation stack;

a first bridge that electrically couples the first electrode and the second electrode to each other, the first electrode, the second electrode, and the first bridge being aligned with each other in a first direction;

a third electrode on the encapsulation stack;

a fourth electrode on the encapsulation stack;

a second bridge that electrically couples the third electrode and the fourth electrode to each other, the third electrode, the fourth electrode, and the second bridge being aligned with each other in a second direction;

an organic dielectric layer that spaces the first electrode, the second electrode, the first bridge, the third electrode, and the fourth electrode from the second bridge; and an inorganic dielectric layer that spaces the first electrode, the second electrode, the first bridge, the third electrode, and the fourth electrode from the second bridge, wherein the inorganic dielectric layer is disposed on the organic dielectric layer, wherein at least one of the first touch electrode, the second touch electrode, the third electrode, the fourth electrode, the first bridge, and the second bridge is disposed on the inorganic dielectric layer, and wherein the inorganic dielectric layer and the organic dielectric layer are disposed between the first bridge and the second bridge.

22. The device of claim 21 wherein the organic dielectric layer is spaced from second bridge by the inorganic dielectric layer.

23. The device of claim 21 wherein the organic dielectric layer is spaced from the first electrode, the second electrode, the first bridge, the third electrode, and the fourth electrode by the inorganic dielectric layer.

24. The device of claim 21 wherein the second bridge extends through the organic dielectric layer and the inorganic dielectric layer and contacts the third and fourth electrodes.

25. The device of claim 21 wherein the third and fourth electrodes extend through the organic dielectric layer and the inorganic dielectric layer and contact the second bridge.

26. The device of claim 21 wherein the first and second bridges are aligned with each other.

27. The device of claim 21 wherein at least one of the first electrode, the second electrode, the first bridge, the third electrode, the fourth electrode, and the second bridge includes a plurality of conductive layers.

28. The device of claim 27 wherein the plurality of conductive layers includes at least one of Ti, Al, Mo, MoTi, Cu, Ta, and ITO.

29. The device of claim 21 wherein the organic dielectric layer includes acrylic resin, epoxy resin, polyimide, or polyethylene.

30. The device of claim 21 wherein the inorganic dielectric layer is made of $Al_2O_3$, $TiO_x$, or $SiO_x$.

31. The device of claim 21, further comprising:

a color filter that spaces the substrate from the first electrode, the second electrode, the third electrode, and the fourth electrode.

32. The device of claim 21, further comprising:

a color filter on the first electrode, the second electrode, the third electrode, and the fourth electrode.

33. The device according to claim 21, further comprising:

at least one layer of dielectric film disposed between the substrate and the encapsulation stack.

34. The device of claim 33, further comprising:

a first routing line electrically coupled to the first electrode, the second electrode, and the first bridge; and a second routing line electrically coupled to the third electrode, the fourth electrode, and the second bridge.

35. The device of claim 34 wherein the first and second routing lines are disposed on side surfaces of the encapsulation stack.

36. The device according to claim 34, further comprising:

a first touch pad electrically coupled to the first routing line; and a second touch pad electrically coupled to the second routing line.

37. The device according to claim 36 wherein the first and second touch pads are configured to contact the at least one layer of dielectric film.

38. The device according to claim 21 wherein the encapsulation stack includes an inorganic encapsulation layer and an organic encapsulation layer.

* * * * *